(12) United States Patent
Matsushima et al.

(10) Patent No.: US 10,863,621 B2
(45) Date of Patent: Dec. 8, 2020

(54) METAL FOIL WITH RELEASING RESIN LAYER, AND PRINTED WIRING BOARD

(71) Applicant: MITSUI MINING & SMELTING CO., LTD., Tokyo (JP)

(72) Inventors: Toshifumi Matsushima, Ageo (JP); Ayumu Tateoka, Ageo (JP); Fujio Kuwako, Saitama (JP); Shigeru Itabashi, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 54 days.

(21) Appl. No.: 15/122,515

(22) PCT Filed: May 27, 2015

(86) PCT No.: PCT/JP2015/065295
§ 371 (c)(1),
(2) Date: Aug. 30, 2016

(87) PCT Pub. No.: WO2015/186589
PCT Pub. Date: Dec. 10, 2015

(65) Prior Publication Data
US 2017/0071059 A1    Mar. 9, 2017

(30) Foreign Application Priority Data

Jun. 3, 2014   (JP) ................. 2014-115310

(51) Int. Cl.
*H05K 1/09*     (2006.01)
*B32B 15/08*    (2006.01)
(Continued)

(52) U.S. Cl.
CPC .............. *H05K 1/09* (2013.01); *B32B 15/08* (2013.01); *B32B 15/20* (2013.01);
(Continued)

(58) Field of Classification Search
CPC ...... H05K 1/09; H05K 3/4682; H05K 1/0298; H05K 3/46; B32B 15/20; B32B 15/08;
(Continued)

(56) References Cited

U.S. PATENT DOCUMENTS 5,391,611  A  *  2/1995  Funayama ............... C08K 9/04
                                                    524/127
2015/0296632 A1* 10/2015  Fujino .................... H05K 3/387
                                                    156/150

FOREIGN PATENT DOCUMENTS

JP      2004182721 A  *  7/2004
JP      2009-272589 A    11/2009
(Continued)

OTHER PUBLICATIONS

Translation to English for WO 2014/046256. accessed: Apr. 11, 2017.*
(Continued)

*Primary Examiner* — Nancy R Johnson
(74) *Attorney, Agent, or Firm* — Greenblum & Bernstein, P.L.C.

(57) ABSTRACT

There is provided with a metal foil-releasable resin layer composite comprising a metal foil and a releasable resin layer on at least one surface of the metal foil, wherein the releasable resin layer includes 100 parts by mass, in total, of (A) 50 to 95 parts by mass of a nonpolar resin, (B) 4 to 40 parts by mass of a thermosetting resin, and (C) 1 to 25 parts by mass of a release agent, wherein the mass ratio (A/B) of the nonpolar resin (A) to the thermosetting resin (B) is 55/45 to 96/4. The metal foil-releasable resin layer composite can achieve release with significantly low release strength between the metal foil and the releasable resin layer without damage of the releasable resin layer and can withstand hot pressing.

14 Claims, 2 Drawing Sheets

(51) Int. Cl.
*B32B 15/20* (2006.01)
*H05K 1/02* (2006.01)
*H05K 3/46* (2006.01)
*C09D 123/08* (2006.01)

(52) U.S. Cl.
CPC ..... *C09D 123/0853* (2013.01); *H05K 1/0298* (2013.01); *H05K 3/46* (2013.01); *H05K 3/4682* (2013.01); *B32B 2457/08* (2013.01)

(58) Field of Classification Search
CPC ...... B32B 2457/08; C09D 5/20; C09D 5/008; B29C 33/68; Y10T 428/1476
See application file for complete search history.

(56) References Cited

FOREIGN PATENT DOCUMENTS

| JP | 2010-092907 A | 4/2010 |
|---|---|---|
| JP | 5936794 B2 | 6/2016 |
| TW | 201132734 A | 10/2011 |
| TW | 201420332 A | 6/2014 |
| WO | 2014/046256 A1 | 3/2014 |
| WO | 2014/046291 A1 | 3/2014 |
| WO | 2014/054812 A1 | 4/2014 |

OTHER PUBLICATIONS

Translation to English of JP 2004-182721 A by espacenet. accessed Jan. 2, 2020. (Year: 2004).*
Chinese Office Action issued with respect to Application No. 201580020839.4, dated Feb. 16, 2017.
International Search Report and Written Opinion issued with respect to application No. PCT/JP2015/065295, dated Aug. 18, 2015.
Taiwanese Office Action issued with respect to application No. 104117783, dated Aug. 24, 2016.
Japanese Office Action issued with respect to application No. 2015-553949, dated Jan. 4, 2016.

* cited by examiner

METAL FOIL WITH RELEASING RESIN LAYER, AND PRINTED WIRING BOARD

TECHNICAL FIELD

The present invention relates to a metal foil-releasable resin layer composite and a printed wiring board.

BACKGROUND ART

In recent years, multilayer printed wiring boards have gradually been prevalent to meet a decrease in size of and an increase in packaging density on the printed wiring board. Such multilayer printed wiring boards have been used for reductions in weight and size of many portable electronic devices. Requirements for the multilayer printed wiring boards include a further reduction in thickness of the insulating interlayer and a further reduction in weight of the wiring board itself.

To meet such requirements, a recent method of manufacturing a multilayer printed wiring board employs a coreless build-up process which alternately laminates insulating resin layers and conductive layers without use of a so-called core substrate.

For example, PTL 1 (JP2010-92907A) discloses a method for manufacturing a multilayer printed wiring board by a coreless build-up process using a supporting substrate, including a step of laminating a base copper foil and insulating layer-forming member with an organic rust inhibitor coating therebetween to form a supporting substrate, a step of providing a build-up wiring layer on the surface of the base copper foil of the supporting substrate to form a supporting substrate with a build-up wiring layer, a step of separating the supporting substrate provided with a build-up wiring layer at the interface of the base copper foil and the insulating layer to form a multilayer copper-clad laminate, which undergoes necessary processing to manufacture the multilayer printed wiring board.

PTL 2 (JP2009-272589A) discloses a metal foil with a carrier. The metal foil with a carrier is composed of a plate-shaped carrier of a synthetic resin that may be a prepreg and a mechanically releasable metal foil in close contact with one or two sides of the carrier. The prepreg is a general term for a composite material impregnated with synthetic resin in a reinforcing substrate, such as a synthetic resin plate, a glass plate, woven glass fabric, nonwoven glass fabric, or paper. PTL 2 discloses that the release strength between the plate-shaped carrier and the metal foil is desirably 1 g/cm to 1 kg/cm, but does not disclose experimental examples for measuring such a release strength.

CITATION LIST

Patent Literature

PTL 1: JP2010-92907A
PTL 2: JP2009-272589A

SUMMARY OF INVENTION

The reinforcing substrate for the prepreg is expensive. In addition, the surface waviness, for example, caused by folds of the fiber propagates during lamination of build-up layers to significantly affect the waviness of the build-up wiring layer in some reinforcing substrates. It is advantageous, therefore, that a mechanically releasable resin layer containing no prepreg is provided on the metal foil. Furthermore, if the required support could be ensured by the self-supporting ability of the metal foil itself or other laminated members, it would not be necessary to provide a resin layer with supporting ability for the carrier using the prepreg or the like. Accordingly, the present inventors have studied the formation of a resin layer containing no prepreg on at least one surface of the metal foil. The actual fabrication of the metal foil provided with such a resin layer containing no prepreg has been attempted; however, the metal foil had problems such as difficulty of releasing the metal foil from the resin layer due to the high release strength or damage (e.g., breaking, cracking) of the releasable resin layer. In particular, the releasable resin layer is required to be formed of material capable of withstanding hot pressing during the process of manufacturing the printed wiring board (e.g., no positional shift due to fluidization during the hot pressing). Since resin materials which satisfy such requirements have relatively high heat resistance, the releasable resin layer formed of an ordinary thermosetting resin is generally brittle and easy to break when released. Accordingly, a metal foil-releasable resin layer composite provided with such a releasable resin layer that withstands hot pressing and has desirable release characteristics is desired.

The present inventors have found that, in a metal foil-releasable resin layer composite, which is provided with a releasable resin layer on at least one surface of the metal foil, by adopting a releasable resin layer containing a nonpolar resin, a thermosetting resin, and a release agent at a predetermined mixing ratio, it is possible to achieve release with significantly low release strength between the metal foil and the releasable resin layer without damage of the releasable resin layer despite containing material capable of withstanding hot pressing.

Accordingly, it is an object of the present invention to provide a metal foil-releasable resin layer composite which can achieve release with significantly low release strength between the metal foil and the releasable resin layer without damage of the releasable resin layer and can withstand hot pressing.

According to an aspect of the present invention, there is provided a metal foil-releasable resin layer composite comprising a metal foil and a releasable resin layer on at least one surface of the metal foil. The releasable resin layer includes 100 parts by mass, in total, of
(A) 50 to 95 parts by mass of a nonpolar resin,
(B) 4 to 40 parts by mass of a thermosetting resin, and
(C) 1 to 25 parts by mass of a release agent, wherein the mass ratio (A/B) of the nonpolar resin (A) to the thermosetting resin (B) is 55/45 to 96/4.

According to another aspect of the present invention, there is provided a printed wiring board prepared using a metal foil-releasable resin layer composite according to the present invention.

DESCRIPTION OF EMBODIMENT

Metal Foil-Releasable Resin Layer Composite

Figure 1:
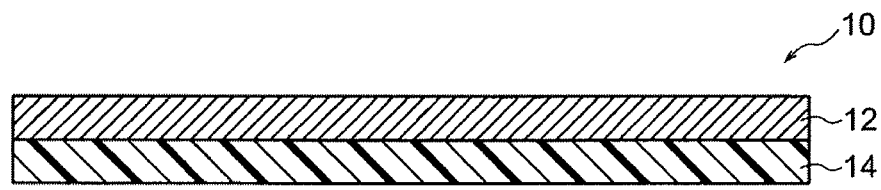
FIG. 1 is a schematic cross-sectional view illustrating an exemplary metal foil-releasable resin layer composite according to the present invention.
Figure 2:
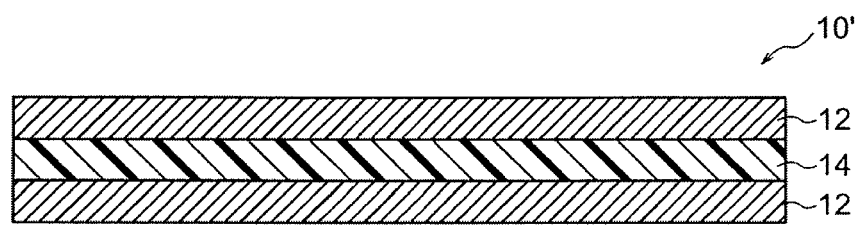
FIG. 2 is a schematic cross-sectional view illustrating another exemplary metal foil-releasable resin layer composite according to the present invention.

FIG. 1 shows a metal foil-releasable resin layer composite of the present invention schematically. As shown in FIG. 1, a metal foil-releasable resin layer composite 10 of the present invention includes a releasable resin layer 14 on at least one surface of a metal foil 12. A releasable resin layer 14 may be provided on two sides of the metal foil 12 or, alternatively, as shown in FIG. 2, the metal foil 12 may be provided on two sides of the releasable resin layer 14. The releasable resin layer 14 includes 100 parts by mass, in total, of (A) 50 to 95 parts by mass of a nonpolar resin, (B) 4 to 40 parts by mass of a thermosetting resin, and (C) 1 to 25 parts by mass of a release agent, wherein the mass ratio (A/B) of the nonpolar resin (A) to the thermosetting resin (B) is 55/45 to 96/4. A releasable resin layer 14 composed of the resin composition having such a specific composition can withstand hot pressing and attain desirable releasing characteristics. In other words, the releasable resin layer 14 can be released from the metal foil 12 with significantly low release strength without damage of the releasable resin layer 14.

As described above, the metal foil with a carrier is known which is composed of a plate-shaped carrier of a synthetic resin that may be a prepreg and a mechanically releasable metal foil in close contact with one or two sides of the carrier (see, for example, PTL 2). The reinforcing substrate for the prepreg is formed of expensive material, and the surface waviness caused by the folds of the fiber propagates during lamination of build-up layers to significantly affect the waviness of the build-up wiring layer in some reinforcing substrates. It is advantageous, therefore, that a mechanically releasable resin layer containing no prepreg be provided on the metal foil. Furthermore, if the required support could be ensured by the self-supporting ability of the metal foil itself or other laminated members, it would not be necessary to provide a resin layer with supporting ability for the carrier using the prepreg or the like. The actual fabrication of the metal foil provided with the resin layer containing no prepreg has been attempted; however, the metal foil had problems such as difficulty of releasing the metal foil from the resin layer due to the high release strength or destruction (e.g., breaking, cracking) of releasable resin layer. In particular, the releasable resin layer is required to be formed of material capable of withstanding hot pressing during the process of manufacturing the printed wiring board (e.g., no positional shift due to fluidization during the hot pressing). Since resin materials which satisfy such requirements have relatively high heat resistance, the releasable resin layer formed of an ordinary thermosetting resin is generally brittle and easy to break when released. Conversely, a significantly soft resin layer has a large thermal expansion coefficient and thus the resin layer readily shifts by the pressure during the lamination. Such a resin layer is not appropriate for the printed wiring board in the first place. Accordingly, a metal foil-releasable resin layer composite provided with such a releasable resin layer that withstands hot pressing and has desirable release characteristics is desired. In this regard, the releasable resin layer 14 composed of the resin composition of the present invention can withstand hot pressing and can be released from the metal foil 12 with significantly low release strength without damage of the releasable resin layer 14.

Thus, it is preferred that the metal foil 12 be mechanically releasable without damage of the releasable resin layer 14. The release strength (peel strength) of the metal foil 12 from the releasable resin layer 14, determined in accordance with JIS C 6481 (1996), is preferably 1 to 100 g/cm, more preferably 5 to 50 g/cm, even more preferably 7 to 40 g/cm, and particularly preferably 10 to 40 g/cm. The release strength within the above range secures the required adhesion between the metal foil 12 and the releasable resin layer 14 and provides excellent release characteristics without disadvantages such as resin residues due to damage of the releasable resin layer 14 during the releasing operation.

As shown in FIG. 2, it is particularly preferred to dispose two metal foils 12 on two surfaces of the releasable resin layer 14 to form a metal foil-releasable resin layer composite 10'. Thus, after a build-up wiring layer is formed on each of the metal foils 12 of the metal foil-releasable resin layer composite 10' to fabricate a laminate (for example, a copper-clad laminate), the laminate with the build-up wiring layers is separated between the releasable resin layer 14 and each of metal foils 12 to be subjected to subsequent processing for printed wiring boards. As a result, the efficiency for manufacturing printed wiring boards can be greatly improved. A metal foil-releasable resin layer composite 10' has self-supporting properties on the whole by the self-supporting properties of the two metal foils 12 on two sides of the metal foil-releasable resin layer composite 10'.

The metal foil 12 may be composed of any known material without particular limitations, and can be either rolled foil or electrolytic foil. Examples of the metal foil 12 includes copper foil, copper alloy foil, aluminum foil, aluminum alloy foil, nickel foil, nickel alloy foil, zinc foil, zinc alloy foil, stainless steel foil, titanium foil, and any combination thereof, preferably copper foil and copper alloy foil. As described above, the two metal foils 12 may be provided on the two surfaces of the releasable resin layer 14. In this case, one of the metal foils 12 may be composed of copper foil or copper alloy foil and the other may be of any other material (e.g., stainless steel foil), while both of the two metal foils 12 may be composed of copper foil or copper alloy foil. In any case, the statement that at least one of the metal foils is a copper foil or a copper alloy foil is preferred to include the case where two metal foils are used.

The metal foil 12 may have any thickness, for example, preferably 7 to 210 μm, more preferably 9 to 105 μm, even more preferably 12 to 70 μm. Such a thickness within this range facilitates handling of the foil and can eliminate a carrier such as carrier foil or carrier resin foil.

The metal foil 12 may be unprocessed metal foil (so-called raw foil) as it is such as electro-deposited foil or rolled foil, or may be surface-treated foil at least one surface of which is treated. Various surface treatments may be employed for improving the properties (for example, rust resistance, moisture resistance, chemical resistance, acid resistance, heat resistance, and adhesion to the substrate) of the surface of the metal foil or imparting these properties to the surface of the metal foil. The surface treatment may be performed on one surface or two surfaces of the metal foil. Examples of the surface treatment on the copper foil include anti-rust treatment, silane treatment, roughening treatment, and barrier-forming treatment.

The metal foil 12 has preferably a smooth surface without roughening treatment on the side to be bonded to the releasable resin layer 14 from the viewpoint of releasing easiness. For example, the arithmetic average roughness Ra of the smooth surface is preferably in the range of 0.05 to 1.0 µm, more preferably 0.1 to 0.5 µm, determined in accordance with JIS B 0601 (2001). By contrast, the metal foil 12 has preferably a roughened surface on the side not to be bonded to the releasable resin layer 14 for improving the adhesion to the build-up layer. For example, the arithmetic average roughness Ra of the roughened surface on the other side (not to be bonded to the releasable resin layer 14) of the metal foil 12 is preferably 0.05 to 2.0 µm, more preferably 0.2 to 1.0 µm, determined in accordance with JIS B 0601 (2001).

The releasable resin layer 14 includes 100 parts by mass, in total, of
(A) 50 to 95 parts by mass of a nonpolar resin,
(B) 4 to 40 parts by mass of a thermosetting resin, and
(C) 1 to 25 parts by mass of a release agent, wherein the mass ratio (A/B) of the nonpolar resin (A) and the thermosetting resin (B) is 55/45 to 96/4. A releasable resin layer 14 composed of the resin composition having such a composition can withstand hot pressing and desirable releasing characteristics. In other words, the releasable resin layer 14 can be released from the metal foil 12 with significantly low release strength without damage of the releasable resin layer 14. Furthermore, as described above, the releasable resin layer 14 preferably contains no prepreg from the viewpoint of inexpensive material cost and a reduction in waviness of the build-up layer.

The nonpolar resin may be any nonpolar resin. A polar resin tends to have excess adhesion to metal foil, whereas a nonpolar resin can appropriately lower the adhesion to impart releasing easiness to the releasable resin layer 14. Furthermore, a nonpolar resin that is soluble in solvent is preferred because the releasable resin layer 14 can be readily formed by coating. Preferred examples of the solvent-soluble nonpolar resin includes polyolefin resins, polydiene resins, polystyrene resins, ethylene-vinyl acetate copolymers, styrene copolymer rubbers, styrene thermoplastic elastomers, natural rubbers, fluorine resins, and any combinations thereof. Among them, styrene thermoplastic elastomers are particularly preferred in view of solvent solubility and coating formability. The nonpolar resins may be used alone or in combination. The content of the nonpolar resins in the releasable resin layer 14 is 50 to 95 parts by mass, preferably 55 to 90 parts by mass, more preferably 60 to 80 parts by mass relative to the total content (100 parts by mass) of nonpolar resins, thermosetting resins and release agents.

The thermosetting resin may be any known thermosetting resin having a thermosetting functional group. The thermosetting resin can impart hot pressing resistance to the releasable resin layer 14. Preferred examples of the thermosetting resin include phenolic resins, urea resins, melamine resins, epoxy resins, diallyl phthalate resins, unsaturated polyester resins, polyurethane resins, polyimide resins, resins having a vinyl group (e.g., styrene-modified resin), and any combination thereof. Particularly preferred are vinyl-group-containing resins that have compatibility with nonpolar resins. Among these resins, preferred are vinyl group-containing resins having an aromatic hydrocarbon skeleton, especially styrene derivative resins that impart heat resistance to the releasable resin layer. Among them, styrene derivatives of polyphenylene ether resin (hereinafter styrene-modified-polyphenylene ether resins) are particularly preferred in view of retaining heat resistance, release ability, and toughness of the releasable resins. The thermosetting resins may be used alone, or in combination. The content of the thermosetting resin(s) in the releasable resin layer 14 is 4 to 40 parts by mass, preferably 8 to 35 parts by mass, more preferably 15 to 30 parts by mass relative to the total content (100 parts by mass) of nonpolar resin, thermosetting resin and release agent.

The mass ratio (A/B) of the nonpolar resin (A) to the thermosetting resin (B) is 55/45 to 96/4, preferably 58/42 to 92/8, more preferably 60/40 to 90/10. A significantly low A/B ratio or significantly high proportion of thermosetting resin results in a hard and thus brittle releasable resin layer 14. Such a layer is not releasable or is readily damaged due to, for example, breaking or cracking. Conversely, a significantly high A/B ratio or significantly low proportion of thermosetting resin causes the resistance to the hot pressing during the process of manufacturing the printed wiring board to decrease, resulting in a positional shift due to fluidization during the hot pressing.

A known release agent can be appropriately used. The release agent can further facilitates the release ability of the releasable resin layer 14. The preferred release agents are fluorine compounds, silicone compounds, and any combination thereof, more preferably fluorine compounds, which has high release ability. Examples of the fluorine compounds include fluorine surfactants and fluorine oil. Examples of the silicone compounds include silicone oil and silicone emulsions. The content of the release agent in the releasable resin layer 14 is 1 to 25 parts by mass, preferably 1 to 10 parts by mass relative to the total content (100 parts by mass) of nonpolar resins, thermosetting resins and release agents. The content within such a range facilitates the release and prevents surface condensation of the release agent after the formation of the releasable resin layer 14.

The resin composition constituting the releasable resin layer 14 may contain, if necessary, desired amounts of additives, such as a thermoplastic resin, a curing agent, a curing accelerator, a thermoplastic particulate, a colorant, an antioxidant, a flame retardant, a surfactant, a fluorescent agent, a viscosity modifier, and a coupling agents without departing from the scope of the present invention. Thus, the resin composition constituting the releasable resin layer 14 can includes a nonpolar resin, a thermosetting resin, a release agent, and an additive as required (an optional component). The content of such additives may be in a range not departing from the gist of the present invention, for example, 10 parts by mass or less, 5 parts by mass or less, or 3 parts by mass or less relative to the total content (100 parts by mass) of nonpolar resins, thermosetting resins and release agents.

The releasable resin layer 14 may further contain an optional inorganic filler. Thus, the releasable resin layer 14 may consist (essentially) of the above resin composition or may consist (essentially) of the above resin composition and the inorganic filler. Known inorganic fillers usable for resin compositions can be used appropriately. The preferred examples of the organic filler include silica, barium sulfate, barium titanate, talc, kaolin, clay, and alumina. The content, relative to the total amount of the releasable resin layer 14, of the inorganic filler in the releasable resin layer 14 is 70 mass % or less (i.e., 0 to 70 mass %), preferably 50 mass % or less, which may be, for example, 40 mass % or less, 30 mass % or less, 20 mass % or less, 10 mass % or less, or 5 mass % or less (in this case, the content, relative to the total amount of the releasable resin layer 14, of the resin composition in the releasable resin layer 14 is 30 mass % or more (i.e., 30 to 100 mass %), preferably 50 mass % or more, which can be, for example, 60 mass % or more, 70 mass % or more, 80 mass % or more, 90 mass % or more, or 95 mass % or more). It should be noted that if the releasable resin layer 14 does not contain the inorganic filler (i.e., the content of the inorganic filler is 0 mass %), the unit "parts by mass", which is used in reference to each content of nonpolar resin(s), thermosetting resin(s) and release agent(s) in the releasable resin layer 14, can be substantially replaced with "mass %".

The releasable resin layer 14 may have any thickness, for example, preferably 1 to 100 μm, more preferably 5 to 100 μm, still more preferably 10 to 70 μm, particularly preferably 15 to 50 μm. The releasable resin layer 14 having a thickness within such a range is easy to form by applying the resin composition and can secure desirable high shear strength, and thus less likely to suffer from damage such as breaking or cracking.

The releasable resin layer 14 is formed by dissolving a nonpolar resin, a thermosetting resin, a release agent, and an optional inorganic filler in a solvent (preferably an organic solvent such as toluene) in a predetermined composition described above to prepare resin varnish. The resultant resin varnish is applied onto the metal foil 12, dried, and then subjected to heat treatment. The resin varnish has a solid resin content of preferably 5 to 50 mass %, more preferably 15 to 40 mass %. Drying may be any of natural drying, air drying, and heat drying. Furthermore, the heat treatment may be performed under any condition, for example, 50 to 200° C. (preferably 80 to 180° C.) for, for example, 1 to 10 min, preferably 1 to 5 min, to form a desired releasable resin layer 14.

Printed Wiring Board

A metal foil-releasable resin layer composite according to the present invention is suitable for use in manufacturing a printed wiring board. Accordingly, the printed wiring board can be preferably manufactured with a metal foil-releasable resin layer composite according to the present invention. The printed wiring board is typically a multilayer printed wiring board and can have known structural parameters, such as the thickness of the insulating layer, the thickness of the metal foil, and the number of such layers. The printed wiring board may be manufactured by a known method such as a coreless build-up process. For example, in manufacturing of the multilayer printed wiring board by the coreless build-up process, a desirable build-up wiring layer is formed on the metal foil. The releasable resin layer is then released and undergoes necessary treatment to form a desirable printed wiring board.

Figure 3:
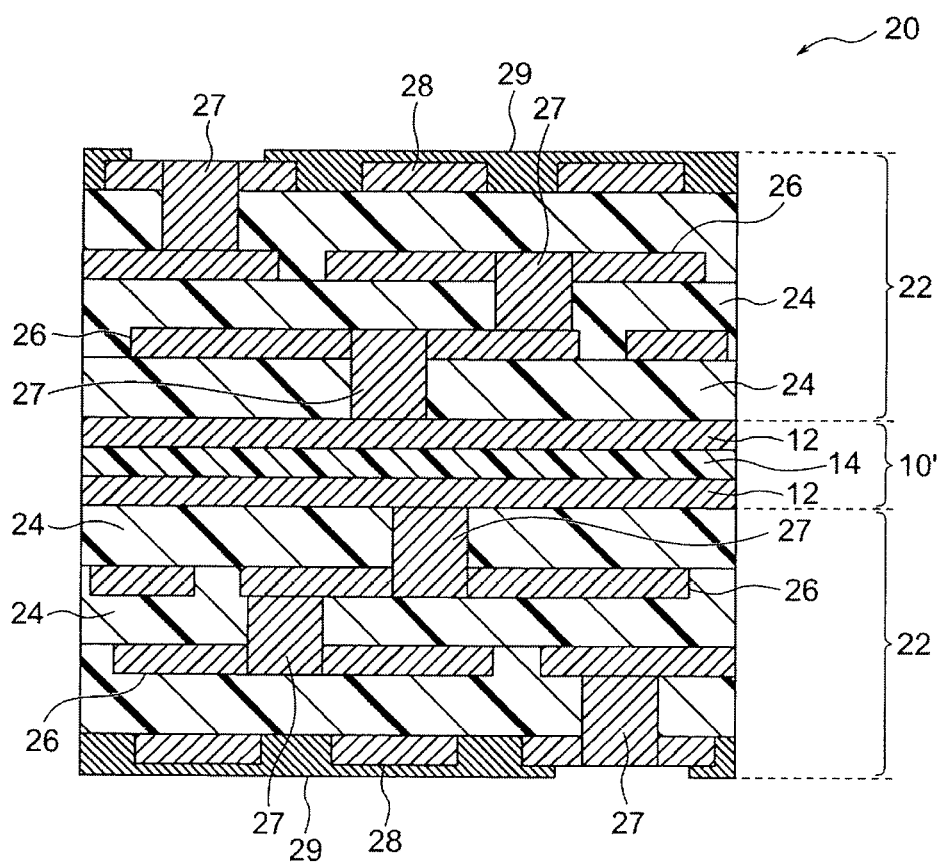
FIG. 3 is a schematic cross-sectional view illustrating the condition of the printed wiring board including a metal foil-releasable resin layer composite according to the present invention immediately before the releasable resin layer is released in the process of manufacturing the board.
Figure 4:
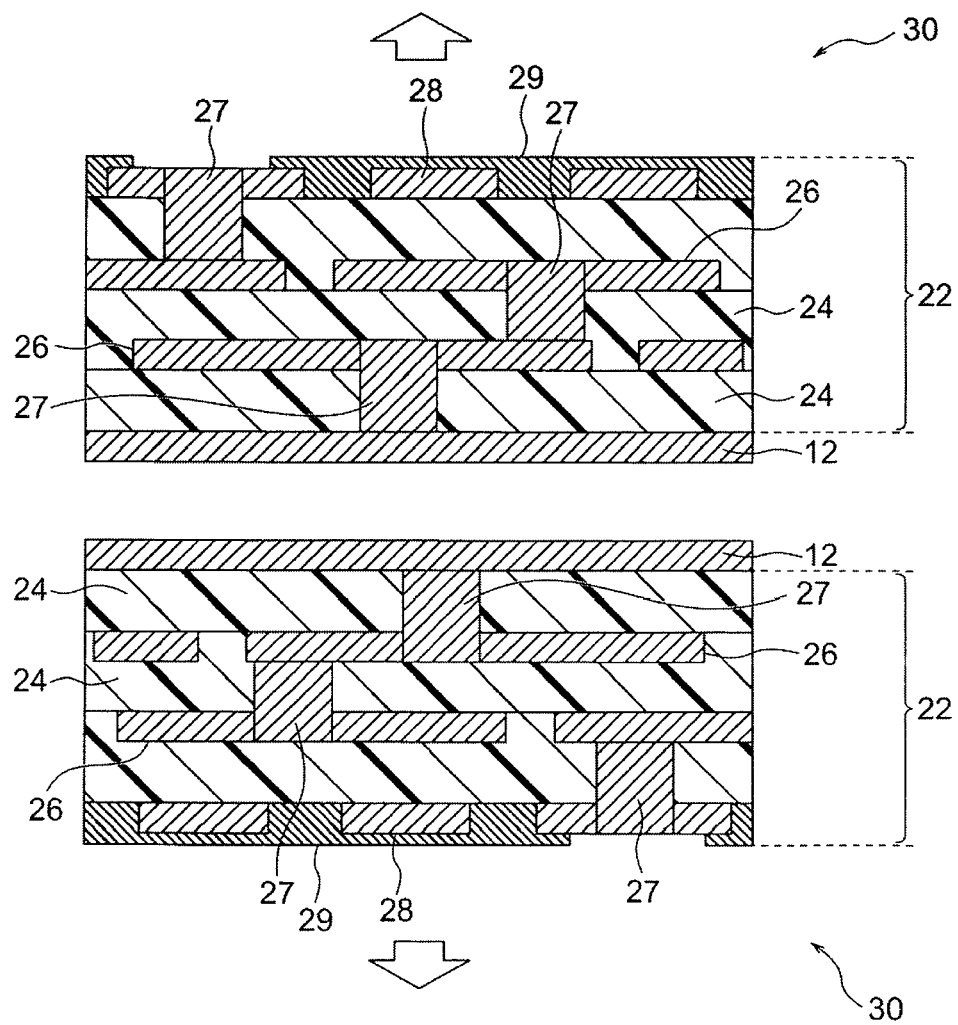
FIG. 4 is a schematic cross-sectional view illustrating the condition of the printed wiring board including a metal foil-releasable resin layer composite according to the present invention immediately after the releasable resin layer is released in the process of manufacturing the board.

Hereinafter, there will be described exemplary embodiments of manufacturing a multilayer printed wiring board using the metal foil-releasable resin layer composite 10' provided with metal foils 12 on two sides as shown FIG. 2 by the coreless build-up process. As shown in FIGS. 3 and 4, this method includes steps of (1) forming a build-up wiring layer 22 on two sides of the metal foil-releasable resin layer composite 10' (i.e., each surface of metal foils 12), (2) separating the resulting laminate with a build-up wiring layer 20 at the interface of the metal foil 12 and the releasable resin layer 14, and (3) processing the resulting multilayer metal-clad laminate 30 into a multilayer printed wiring board. Hereinafter, each step will be described in detail.

(1) Step of Forming Build-Up Wiring Layer

In this step, a build-up wiring layer 22 consisting of alternately laminated insulating layers 24 and wiring layers including inner layer circuit 26 on two sides of a metal foil-releasable resin layer composite 10' (i.e., each surface of the metal foils 12) is formed and optionally hot-pressed to prepare a support with a build-up wiring layer 20 shown in FIG. 3. Any build-up process can be used in the present invention. Such a build-up process includes the method for providing the insulating layers 24 such as laminating a resin film on the surface of the metal foil 12 or applying a resin composition on the surface of the metal foil 12. In the case where the resin film is used as the insulating layer 24, a metal foil such as a copper foil is laminated on the surface of the resin film by simultaneous press working, and then the metal foil is etched to form the inner layer circuit 26 in combination with the formation of layer connection means 27 such as via holes as required. In an alternative embodiment, only the resin film is laminated on the surface of the metal foil 12 and then a pattern of the inner layer circuit 26 is formed on the surface of the resin film by a semi-additive method.

In the case where the insulating layer 24 was formed by applying the resin composition, the resin composition is applied, dried, and cured on the surface of the metal foil 12. The resulting coating was polished, and then the layer connection means 27 such as via holes may be formed as required. In this case, holes may be bored at the desired positions of the cured resin layer. The bored holes may be filled with conductive paste or conductive posts, and then steps such as forming a circuit form on the cured resin layer with the conductive paste or forming the inner layer circuit 26 directly by a semi-additive method is carried out.

A laminate with a build-up wiring layer 20, as shown in FIG. 3, is prepared by repeating the step of forming the build-up wiring layer by the above-described method. In this stage, solder resist 29 may be applied, if necessary, on the outer layer surface provided with an outer layer circuit 28.

In the initial step of forming a build-up wiring layer, the surface of the metal foil 12, except for the part for forming a circuit, may be covered with, e.g., a plating resist, and an outer layer circuit pattern composed of, e.g., gold, tin, or nickel may be preformed. This process can prepare a laminate with a build-up wiring layer having an integrated outer layer circuit formed on one side thereof.

(2) Step of Separating Laminate with Build-Up Wiring Layer

In this step, the laminate with build-up wiring layer 20 prepared in the above step was separated at the interface between the metal foil 12 and releasable resin layer 14 (as shown in FIG. 4) to prepare a multilayer metal-clad laminate 30. Separation at the interface between the metal foil 12 and the releasable resin layer 14 can be carried out by releasing the metal foil 12 and for the releasable resin layer 14.

(3) Step of Forming Multilayer Printed Wiring Board

In this step, each of the multilayer metal-clad laminates 30 prepared in the above separation step is processed into a desired multilayer printed board. The method for processing multilayer metal-clad laminates into multilayer printed wiring board may adopt any of various known methods. For example, the metal foil 12 at an outer layer of the multilayer metal-clad laminate 30 can be etched to form an outer layer circuit wiring, resulting in the multilayer printed wiring board. Furthermore, the metal foil 12 at an outer layer of the multilayer metal-clad laminate 30 can be completely removed by etching to be used as a multilayer printed wiring board as it is. Furthermore, the metal foil 12 at an outer layer of the multilayer metal-clad laminate 30 is completely removed by etching to expose the resin layer, on the exposed surface of which, for example, a circuit form is formed with the conductive paste, or an outer layer circuit is directly formed by a semi-additive method to prepare multilayer printed wiring board.

The above example is an exemplary manufacturing process using a metal foil-releasable resin layer composite 10' provided with a metal foil 12 on two sides thereof. It should be noted that description in above example can also be applied to a metal foil-releasable resin layer composite 10 provided with a metal foil 12 on one side thereof.

EXAMPLES

The present invention will be described in further detail by the following examples.

Example 1

Resin varnish containing a resin composition was prepared and was used to manufacture a copper foil provided with a releasable resin layer. The copper foil provided with a releasable resin layer was evaluated as follows:
(1) Preparation of Resin Varnish 80 parts by mass of styrene thermoplastic elastomer (TR2003, manufactured by JSR Corporation) as a solvent-soluble nonpolar resin, 19 parts by mass of styrene-modified polyphenylene ether resin (OPE-2St 2200, manufactured by Mitsubishi Gas Chemical Company, Inc.) as a thermosetting resin, and 1 part by mass of fluorine-based surfactant (F-553, manufactured by DIC Corporation) as a release agent were dissolved in toluene as solvent to prepare resin varnish having a resin solid content of 25 mass %.
(2) Preparation of Copper Foil with Releasable Resin Layer The resin varnish was uniformly applied onto the electrode surface (arithmetic average roughness Ra: 0.2 μm) of an electrodeposited copper foil having a thickness of 18 μm, air-dried, and heated for 3 min at 150° C. to prepare electrodeposited copper foil provided with a releasable resin layer. In this case, the average thickness of the releasable resin layer was 25 μm.
(3) Evaluation The releasable resin layer of the resulting copper foil with a releasable resin layer was put into close contact with the deposition surface (arithmetic average roughness Ra: 0.5 μm) of another electrodeposited copper foil having a thickness of 18 μm, and the electrode surface (arithmetic average roughness Ra: 0.2 μm) of the another electrodeposited copper foil was put into close contact with the surface of a prepreg (commercially available FR-4 grade) having a thickness of 100 μm. The resulting laminate was hot-pressed at a pressure 30 kgf/cm$^2$ and a temperature of 190° C. for 90 min to manufacture a copper-clad laminate. The copper-clad laminate was then cut into a wok size to form a linear circuit having a width of 50 mm for measurement of release strength. The release strength of the copper foil from the releasable resin layer of the copper-clad laminate was then determined with the linear circuit for the test in accordance with JIS C 6481 (1996). During measurement of the release strength, the damage of the releasable resin layers was visually observed.

Example 2

A copper foil provided with a releasable resin layer was prepared and evaluated as in Example 1 except that 80 parts by mass of styrene thermoplastic elastomer (TR2003, manufactured by JSR Corporation) as a solvent-soluble nonpolar resin, 19 parts by mass of styrene-modified polyphenylene ether resin (OPE-2St 2200, manufactured by Mitsubishi Gas. Chemical Company, Inc.) as a thermosetting resin, and 1 part by mass of silicone-based adhesive (X-40-3270-1, manufactured by Shin-Etsu Chemical Co., Ltd.) as a release agent were used.

Example 3

A copper foil provided with a releasable resin layer was prepared and evaluated as in Example 1 except that 70 parts by mass of styrene thermoplastic elastomer (TR2003, manufactured by JSR Corporation) as a solvent-soluble nonpolar resin, 28 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (F-251, manufactured by DIC Corporation) as a release agent were used.

Example 4

A copper foil provided with a releasable resin layer was prepared and evaluated as in Example 1 except that 70 parts by mass of styrene thermoplastic elastomer (TR2003, manufactured by JSR Corporation) as a solvent-soluble nonpolar resin, 28 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (F-552, manufactured by DIC Corporation) as a release agent were used.

Example 5

A copper foil provided with a releasable resin layer was prepared and evaluated as in Example 1 except that 70 parts by mass of styrene thermoplastic elastomer (TR2003, manufactured by JSR Corporation) as a solvent-soluble nonpolar resin, 28 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (F-553, manufactured by DIC Corporation) as a release agent were used.

Example 6

A copper foil provided with a releasable resin layer was prepared and evaluated as in Example 1 except that 70 parts by mass of styrene thermoplastic elastomer (TR2003, manufactured by JSR Corporation) as a solvent-soluble nonpolar resin, 28 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (F-563, manufactured by DIC Corporation) as a release agent were used.

Example 7

A copper foil provided with a releasable resin layer was prepared and evaluated as in Example 1 except that 70 parts by mass of styrene thermoplastic elastomer (TR2003, manufactured by JSR Corporation) as a solvent-soluble nonpolar resin, 28 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (FC-4430, manufactured by 3M) as a release agent were used.

Example 8

A copper foil provided with a releasable resin layer was prepared and evaluated as in Example 1 except that 70 parts by mass of styrene thermoplastic elastomer (TR2003, manufactured by JSR Corporation) as a solvent-soluble nonpolar resin, 28 parts by mass of styrene-modified polyphenylene ether resin (OPE-2St 2200, manufactured by Mitsubishi Gas Chemical Company, Inc.), as a thermosetting resin, and 2 parts by mass of fluorine-based surfactant (FC-4432, manufactured by 3M) as a release agent were used.

Example 9

A copper foil with a releasable resin layer was prepared and evaluated as in Example 1 except that 90 parts by mass of styrene thermoplastic elastomer (TR2003, manufactured by JSR Corporation) as a solvent-soluble nonpolar resin, 8 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (F-553, manufactured by DIC Corporation) as a release agent were used.

Example 10

A copper foil with a releasable resin layer was prepared and evaluated as in Example 1 except that 60 parts by mass of styrene thermoplastic elastomer (TR2003, manufactured by JSR Corporation) as a solvent-soluble nonpolar resin, 38 parts by mass of styrene-modified polyphenylene ether resin (OPE-2St 2200, manufactured by Mitsubishi Gas Chemical Company, Inc.) as a thermosetting resin, and 2 parts by mass of fluorine-based surfactant (F-553, manufactured by DIC Corporation) as a release agent were used.

Example 11

A copper foil with a releasable resin layer was prepared and evaluated as in Example 1 except that 80 parts by mass of styrene thermoplastic elastomer (TR2003, manufactured by JSR Corporation) as a solvent-soluble nonpolar resin, 15 parts by mass of styrene-modified polyphenylene ether resin (OPE-2St 2200, manufactured by Mitsubishi Gas Chemical Company, Inc.) as a thermosetting resin, and 5 parts by mass of fluorine-based surfactant (F-553, manufactured by DIC Corporation) as a release agent were used.

Example 12

A copper foil with a releasable resin layer was prepared and evaluated as in Example 1 except that 80 parts by mass of styrene thermoplastic elastomer (SIS5229P, manufactured by JSR Corporation) as a solvent-soluble nonpolar resin, 15 parts by mass of styrene-modified polyphenylene ether resin (OPE-2St 2200, manufactured by Mitsubishi Gas Chemical Company, Inc.) as a thermosetting resin, and 5 parts by mass of fluorine-based surfactant (F-553, manufactured by DIC Corporation) as a release agent were used.

Example 13

A copper foil with a releasable resin layer was prepared and evaluated as in Example 1 except that 80 parts by mass of styrene thermoplastic elastomer (TR2003, manufactured by JSR Corporation) as a solvent-soluble nonpolar resin, 10 parts by mass of styrene-modified polyphenylene ether resin (OPE-2St 2200, manufactured by Mitsubishi Gas Chemical Company, Inc.) as a thermosetting resin, and 10 parts by mass of fluorine-based surfactant (F-553, manufactured by DIC Corporation) as a release agent were used.

Example 14

A copper foil with a releasable resin layer was prepared and evaluated as in Example 1 except that 60 parts by mass of styrene thermoplastic elastomer (TR2003, manufactured by JSR Corporation) as a solvent-soluble nonpolar resin, 30 parts by mass of styrene-modified polyphenylene ether resin (OPE-2St 2200, manufactured by Mitsubishi Gas Chemical Company, Inc.) as a thermosetting resin, and 10 parts by mass of fluorine-based surfactant (F-553, manufactured by DIC Corporation) as a release agent were used.

Example 15

A copper foil with a releasable resin layer was prepared and evaluated as in Example 1 except that 50 parts by mass of styrene thermoplastic elastomer (TR2003, manufactured by JSR Corporation) as a solvent-soluble nonpolar resin, 25 parts by mass of styrene-modified polyphenylene ether resin (OPE-2St 2200, manufactured by Mitsubishi Gas Chemical Company, Inc.) as a thermosetting resin, and 25 parts by mass of fluorine-based surfactant (F-553, manufactured by DIC Corporation) as a release agent were used.

Example 16 (Comparative)

A copper foil with a releasable resin layer was prepared and evaluated as in Example 1 except that only 100 parts by mass of styrene thermoplastic elastomer (TR2003, manufactured by JSR Corporation) as a solvent-soluble nonpolar resin was used.

Example 17 (Comparative)

A copper foil with a releasable resin layer was prepared and evaluated as in Example 1 except that 90 parts by mass of styrene thermoplastic elastomer (TR2003, manufactured by JSR Corporation) as a solvent-soluble nonpolar resin and 10 parts by mass of styrene-modified polyphenylene ether resin (OPE-2St 2200, manufactured by Mitsubishi Gas Chemical Company, Inc.) as a thermosetting resin were used.

Example 18 (Comparative)

A copper foil with a releasable resin layer was prepared and evaluated as in Example 1 except that 98 parts by mass of styrene thermoplastic elastomer (TR2003, manufactured by JSR Corporation) as a solvent-soluble nonpolar resin (without thermosetting resin) and 2 parts by mass of fluorine-based surfactant (F-553, manufactured by DIC Corporation) as a release agent were used.

Example 19 (Comparative)

A copper foil with a releasable resin layer was prepared and evaluated as in Example 1 except that 50 parts by mass of styrene thermoplastic elastomer (TR2003, manufactured by JSR Corporation) as a solvent-soluble nonpolar resin, 48 parts by mass of styrene-modified polyphenylene ether resin (OPE-2St 2200, manufactured by Mitsubishi Gas Chemical Company, Inc.) as thermosetting resin, and 2 parts by mass of fluorine-based surfactant (F-553, manufactured by DIC Corporation) as a release agent were used.

Example 20 (Comparative)

A copper foil with a releasable resin layer was prepared and evaluated as in Example 1 except that 50 parts by mass of styrene thermoplastic elastomer (TR2003, manufactured by JSR Corporation) as a solvent-soluble nonpolar resin, 20 parts by mass of styrene-modified polyphenylene ether resin (OPE-2St 2200, manufactured by Mitsubishi Gas Chemical Company, Inc.) as a thermosetting resin, and 30 parts by mass of fluorine-based surfactant (F-553, manufactured by DIC Corporation) as a release agent were used.

Example 21 (Comparative)

A copper foil with a releasable resin layer was prepared and evaluated as in Example 1 except that 70 parts by mass of styrene thermoplastic elastomer (TR2003, manufactured by JSR Corporation) as a solvent-soluble nonpolar resin, 18 parts by mass of Bisphenol F-type epoxy resin (YDF-8170C, manufactured by Nippon Steel & Sumikin Chemical Co., Ltd.) as a thermosetting resin, 11 parts by mass of phenolic resin (MEH7500, Meiwa Plastic Industries, Ltd.) as a curing agent for epoxy resin, and 1 part by mass of imidazole (2E4MZ, manufactured by Shikoku Chemicals Corporation) as a curing accelerator of epoxy resin, and a mixed solvent (toluene/methyl ethyl ketone=1/1) as solvent were used.

Example 22

A copper foil with a releasable resin layer was prepared and evaluated as in Example 1 except that 80 parts by mass of styrene thermoplastic elastomer (TR2827, manufactured by JSR Corporation) as a solvent-soluble nonpolar resin, 15 parts by mass of styrene-modified polyphenylene ether resin (OPE-2St 2200, manufactured by Mitsubishi Gas Chemical Company, Inc.) as a thermosetting resin, and 5 parts by mass of fluorine-based surfactant (F-553, manufactured by DIC Corporation) as a release agent were used.

Example 23

A copper foil with a releasable resin layer was prepared and evaluated as in Example 1 except that 80 parts by mass of styrene thermoplastic elastomer (TR2003, manufactured by JSR Corporation) as a solvent-soluble nonpolar resin, 15 parts by mass of styrene-modified polyphenylene ether resin (OPE-2St 1200, manufactured by Mitsubishi Gas Chemical Company, Inc.) as a thermosetting resin, and 5 parts by mass of fluorine-based surfactant (F-553, manufactured by DIC Corporation) as a release agent were used.

Result

The evaluation results obtained in Examples 1 to 23 were as shown in Tables 1 and 2. No fluidization, hence, no positional shifts of the releasable resin layer during the hot pressing were observed at least in Examples 1 to 15, 22, and 23. These results demonstrate that the present invention can provide a metal foil-releasable resin layer composite which can achieve release with significantly low release strength between the metal foil and the releasable resin layer without damage of the releasable resin layer and can withstand hot pressing.

TABLE 1

| | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 |
|---|---|---|---|---|---|---|---|---|---|---|---|---|---|
| Nonpolar resin (A) (parts by mass) | TR2003 | 80 | 80 | 70 | 70 | 70 | 70 | 70 | 70 | 90 | 60 | 80 | |
| | TR2827 | | | | | | | | | | | | |
| | SIS5229P | | | | | | | | | | | | 80 |
| Thermosetting resin (B) (parts by mass) | OPE-2St 2200 | 19 | 19 | 28 | 28 | 28 | 28 | 28 | 28 | 8 | 38 | 15 | 15 |
| | OPE-2St 1200 | | | | | | | | | | | | |
| | YDF-8170C/ MEH7500/ 2E4MZ | | | | | | | | | | | | |
| Release agent (C) (parts by mass) | F-251 | | | | 2 | | | | | | | | |
| | F-552 | | | | | 2 | | | | | | | |
| | F-553 | 1 | | | | | 2 | | | | 2 | 2 | 5 | 5 |
| | F-563 | | | | | | | 2 | | | | | |
| | FC4430 | | | | | | | | 2 | | | | |
| | FC4432 | | | | | | | | | 2 | | | |
| | X-40-3270-1 | | 1 | | | | | | | | | | |
| Mass ratio of nonpolar resin:thermosetting resin | | 81:19 | 81:19 | 71:29 | 71:29 | 71:29 | 71:29 | 71:29 | 71:29 | 92:8 | 61:39 | 84:16 | 84:16 |
| Evaluation result | Release strength [g/cm] | 96 | 88 | 45 | 65 | 65 | 52 | 35 | 22 | 90 | 79 | 26 | 55 |
| | Resin damage when released | Not found | Not found | Not found | Not found | Not found | Not found | Not found | Not found | Not found | Not found | Not found | Not found |

TABLE 2

| | | Ex. 13 | Ex. 14 | Ex. 15 | Ex. 16* | Ex. 17* | Ex. 18* | Ex. 19* | Ex. 20* | Ex. 21* | Ex. 22 | Ex. 23 |
|---|---|---|---|---|---|---|---|---|---|---|---|---|
| Nonpolar resin (A) (parts by mass) | TR2003 | 80 | 60 | 50 | 100 | 90 | 98 | 50 | 50 | 70 | | 80 |
| | TR2827 | | | | | | | | | | 80 | |
| | SIS5229P | | | | | | | | | | | |
| Thermosetting resin (B) (parts by mass) | OPE-2St 2200 | 10 | 30 | 25 | | 10 | | 48 | 20 | | 15 | |
| | OPE-2St 1200 | | | | | | | | | | | 15 |
| | YDF-8170C/ MEH7500/ 2E4MZ | | | | | | | | | 18/11/1 | | |
| Release agent (C) | F-251 | | | | | | | | | | | |
| | F-552 | | | | | | | | | | | |

TABLE 2-continued

|  |  | Ex. 13 | Ex. 14 | Ex. 15 | Ex. 16* | Ex. 17* | Ex. 18* | Ex. 19* | Ex. 20* | Ex. 21* | Ex. 22 | Ex. 23 |
|---|---|---|---|---|---|---|---|---|---|---|---|---|
| (parts by mass) | F-553 | 10 | 10 | 25 |  |  | 2 | 2 | 30 |  | 5 | 5 |
|  | F-563 |  |  |  |  |  |  |  |  |  |  |  |
|  | FC4430 |  |  |  |  |  |  |  |  |  |  |  |
|  | FC4432 |  |  |  |  |  |  |  |  |  |  |  |
|  | X-40-3270-1 |  |  |  |  |  |  |  |  |  |  |  |
| Mass ratio of nonpolar resin:thermosetting resin |  | 89:11 | 67:33 | 67:33 | 100:0 | 90:10 | 100:0 | 51:49 | 71:29 | 70:30 | 84:16 | 84:16 |
| Evaluation result | Release strength [g/cm] | 11 | 16 | 1 | Unable to release | 230 | Unable to release | 139 | 0 | Unable to release | 40 | 47 |
|  | Resin damage when released | Not found | Not found | Not found | Found | Not found | Found | Not found | Not found | Found | Not found | Not found |

*indicates a comparative example.

The invention claimed is:

1. A metal foil-releasable resin layer composite comprising a metal foil and a releasable resin layer on at least one surface of the metal foil, wherein the releasable resin layer comprises 100 parts by mass, in total, of
   (A) 55 to 95 parts by mass of a nonpolar resin,
   (B) 4 to 40 parts by mass of a thermosetting resin having a vinyl group, and
   (C) 1 to 25 parts by mass of a release agent, wherein the release agent is at least one selected from the group consisting of fluorine surfactants, fluorine oil, silicone oil, and silicone emulsions,
wherein:
the nonpolar resin is a styrene thermoplastic elastomer;
the thermosetting resin having a vinyl group is a styrene-modified polyphenylene ether resin; and
the mass ratio (A/B) of the nonpolar resin (A) to the thermosetting resin (B) is 55/40 to 95/4.

2. The metal foil-releasable resin layer composite according to claim 1, wherein a release strength of the metal foil from the releasable resin layer is 1 to 100 g/cm, determined in accordance with JIS C 6481 (1996).

3. The metal foil-releasable resin layer composite according to claim 1, wherein the metal foil is mechanically releasable without damage of the releasable resin layer.

4. The metal foil-releasable resin layer composite according to claim 1, wherein the releasable resin layer comprises 60 to 80 parts by mass of the nonpolar resin.

5. The metal foil-releasable resin layer composite according to claim 1, wherein the releasable resin layer comprises 15 to 30 parts by mass of the thermosetting resin.

6. The metal foil-releasable resin layer composite according to claim 1, wherein the mass ratio (AB) of the nonpolar resin (A) to the thermosetting resin (B) is 60/40 to 90/10.

7. The metal foil-releasable resin layer composite according to claim 1, wherein the releasable resin layer further comprises an inorganic filler.

8. The metal foil-releasable resin layer composite according to claim 1, wherein the releasable resin layer comprises no prepreg.

9. The metal foil-releasable resin layer composite according to claim 1, wherein each of the two surfaces of the releasable resin layer contacts a metal foil.

10. The metal foil-releasable resin layer composite according to claim 1, wherein the metal foil is a copper foil or a copper alloy foil.

11. The metal foil-releasable resin layer composite according to claim 1, wherein the metal foil has a thickness of 7 to 210 μm and the releasable resin layer has a thickness of 1 to 100 μm.

12. The metal foil-releasable resin layer composite according to claim 1, wherein the release agent is at least one selected from the group consisting of fluorine surfactants, fluorine oil, and silicone oil.

13. The metal foil-releasable resin layer composite according to claim 1, wherein the release agent is at least one selected from the group consisting of fluorine surfactants and fluorine oil.

14. A method of making a printed wiring board component comprising separating at least one metal foil layer from at least one surface of the releasable resin layer of claim 1.

* * * * *